United States Patent
Litzinger et al.

(10) Patent No.: US 10,054,620 B2
(45) Date of Patent: Aug. 21, 2018

(54) METHOD AND DATA PROCESSING ARRANGEMENT FOR DETERMINING THE FREQUENCY, AMPLITUDE AND ATTENUATION OF AT LEAST ONE OUTPUT OSCILLATION IN AN ELECTRICAL ENERGY SUPPLY NETWORK

(71) Applicant: SIEMENS AKTIENGESELLSCHAFT, Munich (DE)

(72) Inventors: Andreas Litzinger, Fuerth (DE); Stefan Piel, Essen (DE)

(73) Assignee: Siemens Aktiengesellschaft, Munich (DE)

( * ) Notice: Subject to any disclaimer, the term of this patent is extended or adjusted under 35 U.S.C. 154(b) by 556 days.

(21) Appl. No.: 14/434,860

(22) PCT Filed: Oct. 10, 2012

(86) PCT No.: PCT/EP2012/070006
§ 371 (c)(1),
(2) Date: Apr. 10, 2015

(87) PCT Pub. No.: WO2014/056531
PCT Pub. Date: Apr. 17, 2014

(65) Prior Publication Data
US 2015/0285847 A1    Oct. 8, 2015

(51) Int. Cl.
*G01R 23/02* (2006.01)
*H02J 3/24* (2006.01)
(Continued)

(52) U.S. Cl.
CPC .............. *G01R 23/02* (2013.01); *G01R 21/00* (2013.01); *G01R 25/00* (2013.01); *H02J 3/24* (2013.01)

(58) Field of Classification Search
CPC .... H02J 7/007; H02J 7/0068; H02J 2003/003; H02J 3/32; H02J 3/382; H02J 3/383;
(Continued)

(56) References Cited

U.S. PATENT DOCUMENTS

| 2010/0217549 A1* | 8/2010 | Galvin | ............... H04B 3/54 |
| | | | 702/62 |
| 2014/0244056 A1* | 8/2014 | Pena | ............... F02C 1/00 |
| | | | 700/287 |

OTHER PUBLICATIONS

Glickman, M., et al.: "Damping Estimation of Electric Disturbances in Distributed Power Systems"; Proceedings of the 7th IASTED International Conference on Signal and Image Processing, 2005, pp. 517-520, Honolulu, Hawaii, US, ISBN 0889865183.
(Continued)

*Primary Examiner* — Roy Y Yi
(74) *Attorney, Agent, or Firm* — Laurence Greenberg; Werner Stemer; Ralph Locher

(57) ABSTRACT

A method for determining a frequency, an amplitude and an attenuation of at least one output oscillation in an electrical energy supply network. A time window of predefined duration is used and momentary values for the output determined within the time window are used to determine the frequency, the amplitude and the attenuation of the at least one output oscillation. At least one further time window is used, wherein all the time windows are each of different duration. That time window, within the duration of which a predefined number of oscillation processes of the output oscillation under consideration falls, is used for determining frequency, amplitude and attenuation. The invention also describes a data processing arrangement.

17 Claims, 2 Drawing Sheets

(51) Int. Cl.
*G01R 21/00* (2006.01)
*G01R 25/00* (2006.01)

(58) Field of Classification Search
CPC .................. H02J 3/386; H02J 13/0006; H02J 2007/0096; H02J 3/00; H02J 50/12; H02J 5/005; H02J 7/0042; H02J 7/0052
USPC ........................................................ 713/323
See application file for complete search history.

(56) References Cited

OTHER PUBLICATIONS

Glickman M. et al.: "Estimation of Modal Damping in Power Networks"; IEEE Transactions on Power Systems, 2007, pp. 1340-1350, vol. 22; No. 3; Piscataway, NJ.

* cited by examiner

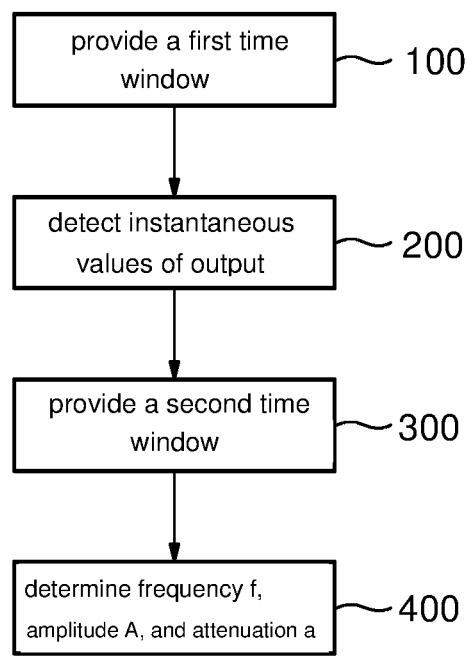

METHOD AND DATA PROCESSING ARRANGEMENT FOR DETERMINING THE FREQUENCY, AMPLITUDE AND ATTENUATION OF AT LEAST ONE OUTPUT OSCILLATION IN AN ELECTRICAL ENERGY SUPPLY NETWORK

BACKGROUND OF THE INVENTION

Field of the Invention

The present invention relates to a method and system for determining the frequency, amplitude, and attenuation of at least one output oscillation in an electrical energy supply network.

Within electrical energy supply networks, for example, in or between different high-voltage networks which are connected to each other, output oscillations may occur due to interactions between energy generators and loads. The strength or amplitude of such output oscillations may increase or decrease over time. Decreasing oscillations are frequently also referred to as attenuated output oscillations. If multiple output oscillations occur at the same time, they may overlap.

In the event of sufficiently large amplitude, output oscillations, for example, in high-voltage networks, may cause the failure of portions or the entirety of the network, thus resulting in a serious interruption of the electrical energy supply. In the event of output oscillations, a preferably early knowledge of the current oscillation amplitudes and their development over time is highly important for initiating countermeasures in a timely manner. In particular, for initiating possible countermeasures, it is important to know whether the output oscillation is increasing over time. In such a case, it may be assumed that a particular risk to the electrical energy supply exists.

The parameters of an output oscillation, namely, frequency, attenuation, and amplitude, cannot in principle be ascertained from measurement at a single point in time, but rather require observation over a finite period of time.

In the presently used methods of the related art, the measurement data, for example, phasor information about the voltage and the current strength, is therefore collected at one or multiple points of the energy supply network at a high time resolution. This may, for example, be carried out with the aid of so-called phasor measurement units (PMUs). The instantaneous output values are determined from the measurement data.

The measurement data are recorded over a previously specified time window, so that the resulting data set may subsequently be processed further in a targeted manner according to various known methods, in order to determine the parameters describing the particular output oscillation. By repeating the evaluation for the instantaneous data in each case using a low cycle time with respect to the time window ("sliding window technique"), the results are updated in correspondingly short intervals.

The publication "Damping estimation of electric disturbances in distributed power systems" by Mark Glickmann and Peter O'Shea, which appeared in 2005 in Proceedings of the 7th IASTED International Conference on Signal and Image Processing, describes the use of a sliding window method for determining the frequency, amplitude, and attenuation of at least one output oscillation in an electrical energy supply network.

BRIEF SUMMARY OF THE INVENTION

The object of the present invention is to provide a method which is improved, in particular more accurate and faster, with respect to the related art, for determining the frequency, amplitude, and attenuation of at least one output oscillation in an electrical energy supply network.

The present invention achieves this object via a method for determining the frequency, amplitude, and attenuation of at least one output oscillation in an electrical energy supply network, in which a time window having a predefined duration is used, and instantaneous values of the output detected within the time window are used for determining the frequency, amplitude, and attenuation of the at least one output oscillation, in that at least one additional time window is used, wherein all time windows each have different durations; that time window within whose duration a predefined number of oscillation processes of the particular output oscillation falls is used in each case for determining the frequency, amplitude, and attenuation.

Thus, the basic idea of the present invention is, by using multiple time windows having a different duration, to make possible a determination of the parameters of the one or multiple output oscillations which is more accurate and faster than if only a single time window were to be used.

The method according to the present invention is advantageous with respect to the related art, because, unlike in the case of known methods, it permits the duration of the multiple time windows to be adapted in an optimal manner to a single or even multiple output oscillations having a given frequency, via the use of multiple time windows.

Thus, if the frequencies of the output oscillations are too low, the accuracy of the determined parameters decreases, since the number of available output oscillation periods in the detected time window, which may be characterized via sinusoidal waves in the first approximation, becomes ever smaller. As a result, the relative accuracy of the determination of the parameters is reduced. In the borderline case, in which less than one single output oscillation period is detected in the time window, a reliable evaluation is generally no longer possible. Since multiple time windows are used in the method according to the present invention, a time window having a sufficient duration may always be used for determining the parameters.

On the other hand, non-usable excess information exists in the case of higher frequencies of the output oscillations. The measurement data included in the time window then comprise an increasing number of output oscillation periods from the past which, however, provide no additional information yield. In addition, in the case of a duration of the time window which is short relative to the high frequencies of the output oscillations, and/or as a result of the historical data component becoming ever larger with an increasing duration of the time window, the effect occurs in which the instantaneous results become increasingly corrupt. In the method according to the present invention, a time window may be used in an advantageous manner here which is sufficiently small to keep the historical data component small.

The use of multiple time windows thus allows determining the parameters of the output oscillations multiple times and simultaneously in each case. It is advantageous that in each case, that time window whose duration best fits the frequency of the output oscillation may be selected for the ultimate provision of the parameters. In the case of multiple output oscillations which occur simultaneously, multiple suitable time windows may be correspondingly selected. The selected time window(s) include no excess information and thus ensure that the determination of the parameters of the output oscillations is carried out as rapidly as possible. The parameters are therefore provided to a control center of the energy supply network in a particularly rapid manner and allow a rapid initiation of countermeasures in the case of dangerous output oscillations. The rapid initiation of countermeasures minimizes the danger of failures or other malfunctions of the energy supply network, thus reducing costs and increasing customer satisfaction.

At the same time, since avoiding excess information results in the historical component of the measurement data remaining small when determining the parameters, the method according to the present invention also increases the accuracy of the determination of the parameters of the output oscillations. The resulting high level of timeliness of the determination of the parameters thus ensures that the parameters characterize the output oscillations in a particularly accurate manner.

In one preferred specific embodiment of the method according to the present invention, the time windows have a duration which is adapted in each case to typical frequencies of output oscillations. This is advantageous, since knowledge of frequently occurring output oscillations in the particular electrical energy supply network makes it possible to use this information to adapt the method in an optimal manner from the outset, thus ensuring maximum accuracy and speed when determining the parameters of the output oscillations.

In one advantageous refinement of the aforementioned specific embodiment of the method according to the present invention, the predefined number is the number of oscillation processes of the particular output oscillation which is barely sufficient in each case for carrying out the determination. As a result, that time window is used whose duration is just long enough to ensure a reliable determination of the parameters. At the same time, it is ensured that the time window used is as small as possible in order to keep the historical portion of the detected instantaneous values small and to ensure a rapid and accurate determination of the parameters. An oscillation process is to be understood to be a complete oscillation, for example, an oscillation process from maximum amplitude to maximum amplitude. An oscillation process thus includes two so-called half-waves. Theoretically, the parameters may already be estimated from a single oscillation process using two half-waves. However, in order to ensure a reliable determination of the parameters, in practice, for example, between 4 and 10 oscillation processes are evaluated in the particular time window.

In another preferred specific embodiment of the method according to the present invention, the detected instantaneous values are stored in a memory having a memory size which permits the storage of the instantaneous values detected in the longest time window. This specific embodiment is advantageous if only one memory is provided, the memory size of which must be just sufficient to save the instantaneous values detected in the longest time window. Since all time windows, including the time windows having a time window with a duration shorter than the longest time window, access the same memory, only one memory is necessary. The memory may be designed, for example, as a circular buffer.

In one preferred specific embodiment of the method according to the present invention, the determination of amplitude and attenuation is repeated regularly at predefined points in time. This is advantageous because the determination is constantly updated, and instantaneous parameters of the output oscillations in the electrical energy supply network are always provided. In this way, for example, a control center always receives instantaneous information about output oscillations in its energy supply network and is able to act accordingly.

In one preferred refinement of the aforementioned specific embodiment of the method according to the present invention, if at least one output oscillation has already been detected, the time interval of the predefined points in time is reduced if the at least one output oscillation detected has a high frequency. This is advantageous because, in the case of output oscillations having high frequencies, i.e., many oscillation processes within a short time, the determination of the parameters may also be updated particularly often with the aid of a time window having a short duration. In this way, for example, a control center receives information about output oscillations in its energy supply network which is even more instantaneous.

In another preferred specific embodiment of the method according to the present invention, the determination of amplitude and attenuation of the at least one output oscillation is carried out for each time window with the aid of a separate data processing branch in each case. As a result, the processing speed is advantageously increased with the aid of a parallelization of the calculation operations.

In another preferred specific embodiment of the method according to the present invention, the data processing branches comprise data processing operations which are carried out on a single data processing device. This is advantageous because the use of data processing operations, for example, individual so-called "threads", is particularly easy to handle in a computer.

In another preferred specific embodiment of the method according to the present invention, the data processing branches comprise data processing devices, in particular processor cores of a multiprocessor core data processing system. This variant is advantageous in that multiprocessor core data processing systems are available today by default in conventional office computers, and a utilization of this computer architecture is expedient for increasing the speed of the method according to the present invention.

The present invention also relates to a data processing system for determining the frequency, amplitude, and attenuation of at least one output oscillation in an electrical energy supply network including a memory having a predefined memory size, in which detected instantaneous values of the output may be stored for determining the frequency, amplitude, and attenuation of the at least one output oscillation; and including an evaluation system which is designed to access the memory and to read out instantaneous values of the output using a time window having a predefined duration, and to use instantaneous values of the output detected within the time window for determining the frequency, amplitude, and attenuation of the at least one output oscillation.

Such a data processing system results from the aforementioned related art.

The object of the present invention is to provide a data processing system which is improved with respect to the related art, which in particular makes possible a more accurate and faster determination of the frequency, amplitude, and attenuation of at least one output oscillation in an electrical energy supply network.

The present invention achieves this object in that the evaluation system is furthermore configured to use at least one additional time window, wherein all time windows each have different durations, and to use that time window within whose duration a predefined number of oscillation processes of the particular output oscillation falls in each case for determining the frequency, amplitude, and attenuation.

The same advantages as initially described for the method according to the present invention analogously result for the data processing system and for the specific embodiments of the data processing system claimed in dependent claims.

FIG. 1 shows a schematic representation of an output oscillation in an electrical energy supply network, which is evaluated with the aid of three time windows having different durations.

BRIEF DESCRIPTION OF THE DRAWING

FIG. 2 shows a flowchart of the steps of a method for implementing the invention.

DESCRIPTION OF THE INVENTION

Figure 1:
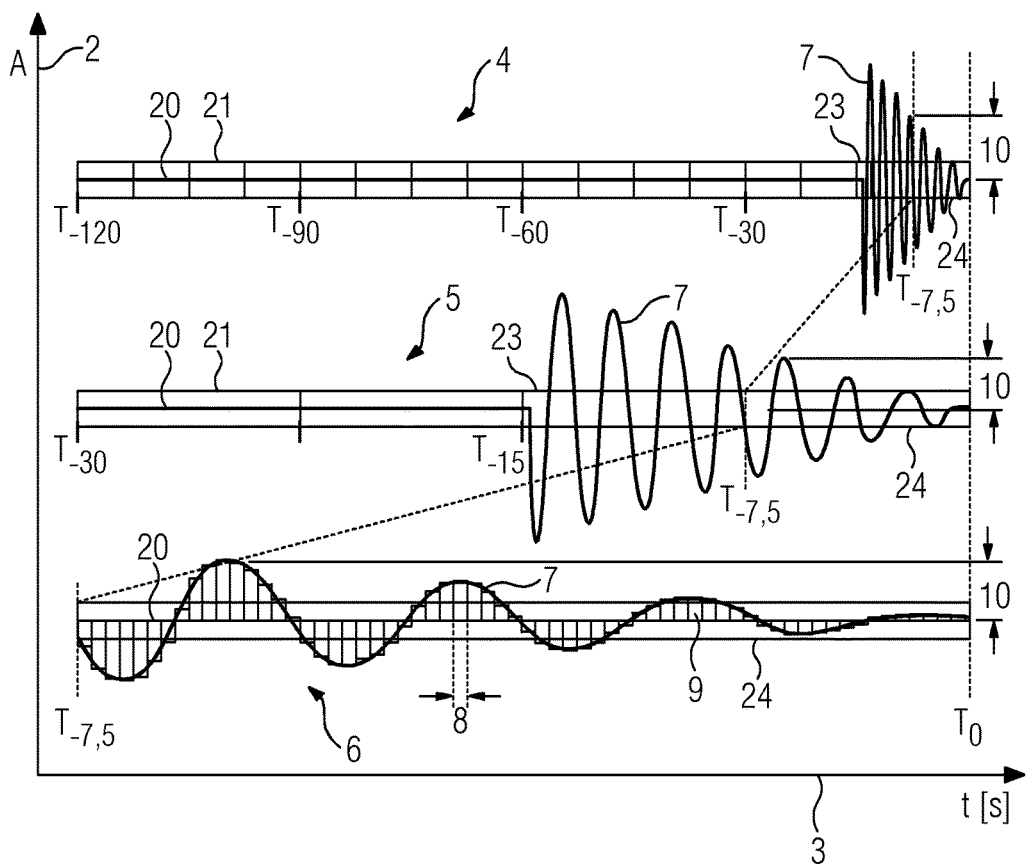
FIG. 1 shows a schematic representation of an output oscillation 7 in an electrical energy supply network. The axis 3 depicts time in seconds, while the axis 2 depicts the amplitude of output oscillations. It is shown how the output oscillation 7 may be evaluated in three different time windows 4, 5, 6.

The upper time window 4 shows the output 20 from a point in time $T_{-120}$ up to a point in time $T_0$. The duration of the time window 4 is thus 120 seconds. To provide better illustration, the period is divided into 16 blocks 21, each having a duration of 7.5 seconds. In the last two blocks 23, 24, an output oscillation 7 occurs, which starts initially having a very large amplitude, and which is heavily attenuated up to the point in time $T_0$. At the point in time $T_{-7.5}$, i.e., 7.5 seconds before the end of the time window, the output oscillation 7 has an amplitude 10.

The second time window 5 shows only the last 30 seconds, i.e., the period of time $T_{-30}$ to $T_0$ of the time window 4. The blocks 21 have the same duration as that of the time window 4. At the point in time $T_{-7.5}$, the output oscillation 7 in turn has an amplitude 10.

Finally, the time window 6 plots the last 7.5 seconds from the time window 4 or the time window 5, i.e., the period of time $T_{-7.5}$ to $T_0$. The time window 6 also depicts how, using a high sampling rate depicted by the boxes 9 having the duration 8 which follow the profile of the output oscillation, a highly accurate determination of the measured values of the output oscillation is ensured.

As is clearly apparent, the output oscillation 7 in the time window 4 comprises only the last 15 seconds of the time window, i.e., two of 16 blocks 21. If the time window 4 is now used for calculating parameters of the output oscillation 7, a great many measured values flow into this evaluation of the parameters, although no output oscillation is present in the electrical energy supply network during the period of time from $T_{-120}$ to $T_{-15}$. The determination of the parameters of the output oscillation 7 thus takes a relatively long time and is less accurate, since the output oscillation 7 forms only a small portion of the overall data volume of the detected output values 20.

In the time window 5, only a quarter of the duration of the time window 4 is considered, resulting in the same output oscillation 7 contributing to half of the output values which are detected within the time window 5. The determination of the parameters of the output oscillation 7 is therefore carried out many times more rapidly and is also more precise than in the time window 4.

In the time window 6, the output oscillation 7 may be determined even more accurately and rapidly, since only the last 7.5 seconds of the output oscillation are considered here, and all detected instantaneous values of the output are related to the output oscillation 7.

By applying the method according to the present invention in the case of the output oscillation 7 illustrated by way of example here, the situation thus results in which three different time windows detect instantaneous values of the output, and the frequency, amplitude, and attenuation parameters of the output oscillation are determined via these instantaneous values. The time window 6 is particularly suitable for determining the attenuation and instantaneous amplitude of the output oscillation 7 rapidly and with a high level of accuracy. Therefore, in the method according to the present invention, the attenuation and amplitude values are provided which are determined with the aid of the time window 6.

In an example other than the one shown here with the output oscillation 7, in which, for example, an output oscillation having a particularly low frequency occurs, one of the other time windows 4, 5 could also be better suited for determining the parameters of the output oscillations. In the case that multiple overlapping output oscillations are present, a combination of the different time windows 4, 5, 6 could also be suitable for determining the attenuation and amplitude of the output oscillations rapidly and with a high level of accuracy. In this case, the time window 4 is particularly suitable for output oscillations having a low frequency, while the time window 5 is particularly suitable for output oscillations having a medium frequency; finally, the time window 6 is particularly suitable for output oscillations having a high frequency.

FIG. 2 shows a method for determining a frequency f, an amplitude A, and an attenuation a of at least one output oscillation in an electrical energy supply network. The method comprises four steps. In a first step 100, a first time window having a predefined duration is provided. In a second step 200, instantaneous values of an output having the at least one output oscillation within the first time window are detected. In a third step 300, at least one second time window having a predefined duration is provided, each of the first and at least one second time windows having mutually different durations. In a fourth step 400 that time window is used within a time duration of which a predefined number of oscillation processes of the particular output oscillation fall for determining the frequency f, the amplitude A, and the attenuation a of the at least one output oscillation.

The invention claimed is:

1. A method for determining a frequency, an amplitude, and an attenuation of at least one output oscillation in an electrical energy supply network and for initiating countermeasures, the method comprising:
   providing a data processing system including a memory, and evaluation system, and a control center:
   in the evaluation system, providing a first time window having a predefined duration; and
   storing, in the memory, detected instantaneous values of an output having the at least one output oscillation within the first time window;
   in the evaluation system, providing at least one second time window having a predefined duration, each of the first and at least one second time windows having mutually different durations;
   in the evaluation system, using that time window within a time duration of which a predefined number of oscillation processes of the particular output oscillation fall for determining a frequency, an amplitude, and an attenuation of the at least one output oscillation; and
   providing the frequency, the amplitude, and the attenuation to the control center to initiate countermeasures and initiating the countermeasures, with the control center, in a timely manner to avoid interruption of electrical energy supply in the electrical energy supply network.

2. The method according to claim 1, which comprises defining the time windows with durations that are adapted in each case to frequently occurring frequencies of the output oscillations.

3. The method according to claim 1, wherein the predefined number is a number of oscillation processes of the particular output oscillation which is just sufficient in each case for carrying out the determination.

4. The method according to claim 1, which comprises storing the detected instantaneous values in the memory, the memory having a memory size which permits the storage of the instantaneous values detected in a longest time window of the time windows.

5. The method according to claim 1, which comprises repeating the determination of the amplitude and attenuation regularly at predefined points in time.

6. The method according to claim 5, wherein, if at least one output oscillation has already been detected, reducing a time interval of the predefined points in time if the at least one output oscillation so detected has a relatively high frequency.

7. The method according to claim 1, which comprises carrying out the determination of the amplitude and the attenuation of the at least one output oscillation for each time window with the aid of a separate processing branch in each case.

8. The method according to claim 7, wherein the data processing branches comprise data processing operations carried out on a single data processing device.

9. The method according to claim 7, wherein the processing branches comprise data processing devices.

10. The method according to claim 9, wherein the processing branches comprise processor cores of a multiprocessor core data processing system.

11. A combination, comprising:
 a data processing system for determining a frequency, an amplitude, and an attenuation of at least one output oscillation in an electrical energy supply network, the system comprising:
  a memory having a predefined memory size and being configured to store detected instantaneous values of an output for determining the frequency, the amplitude, and the attenuation of the at least one output oscillation; and
  an evaluation system configured to access the memory and to read out instantaneous values of the output using a time window having a predefined duration, and to use instantaneous values of the output detected within the time window for determining the frequency, the amplitude, and the attenuation of the at least one output oscillation;
  said evaluation system being furthermore configured to use at least one additional time window, each of the time windows having mutually different durations, and to use that time window within whose duration a predefined number of oscillation processes of the particular output oscillation fall in each case for determining the frequency, the amplitude, and the attenuation; and
 a control center for obtaining the frequency, the amplitude, and the attenuation in order to initiate countermeasures in a timely manner to avoid interruption of electrical energy supply in the electrical energy supply network.

12. The combination according to claim 11, wherein said evaluation system is configured to enable the respective durations of the additional time windows to be adapted in each case to frequently occurring frequencies of the output oscillations.

13. The combination according to claim 11, wherein said evaluation system is configured to so that the predefined number is the number of oscillation processes of the particular output oscillation which is barely sufficient in each case for carrying out the determination.

14. The combination according to claim 11, wherein the memory size is adapted to permit a storage of the instantaneous values detected in a longest said time window.

15. The combination according to claim 11, wherein said evaluation system is configured to repeat the determination of the amplitude and output regularly at predefined points in time and, if at least one output oscillation has already been detected, to reduce the time interval of the predefined points in time if the at least one output oscillation detected has a relatively high frequency.

16. The combination according to claim 11, which comprises multiple data processing branches, and wherein a separate data processing branch is provided in each case for determining the amplitude and the attenuation of the at least one output oscillation for each time window.

17. The combination according to claim 16, wherein the multiple data processing branches are multiple processor cores of a multiprocessor core data processing system.

* * * * *